(12) United States Patent
Rafferty et al.

(10) Patent No.: US 6,495,474 B1
(45) Date of Patent: Dec. 17, 2002

(54) METHOD OF FABRICATING A DIELECTRIC LAYER

(75) Inventors: Conor Stefan Rafferty, Summit, NJ (US); Glen David Wilk, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 54 days.

(21) Appl. No.: 09/659,668

(22) Filed: Sep. 11, 2000

(51) Int. Cl.[7] .................. H01L 21/31; H01L 21/469; H01L 21/265
(52) U.S. Cl. .................. 438/766; 438/785; 438/520; 438/514
(58) Field of Search .................. 438/585, 287, 438/514, 515, 520, 528, 766, 769, 799

(56) References Cited

U.S. PATENT DOCUMENTS

| | | | |
|---|---|---|---|
| 4,826,787 A | 5/1989 | Muto et al. | 437/208 |
| 5,122,479 A | 6/1992 | Audet et al. | 437/200 |
| 5,139,869 A * | 8/1992 | Euen et al. | 257/411 |
| 5,772,862 A | 6/1998 | Ando et al. | 204/298.13 |
| 5,907,780 A | 5/1999 | Gilmer et al. | 438/299 |
| 5,912,797 A | 6/1999 | Schneemeyer et al. | 361/311 |
| 5,923,056 A | 7/1999 | Lee et al. | 257/192 |
| 5,993,947 A | 11/1999 | Cava et al. | 428/210 |
| 6,013,553 A * | 1/2000 | Wallace et al. | 257/213 |
| 6,020,243 A | 2/2000 | Wallace et al. | 438/287 |
| 6,184,072 B1 * | 2/2001 | Kaushik et al. | 438/197 |
| 6,235,648 B1 * | 5/2001 | Mizuhara et al. | 438/618 |
| 6,258,655 B1 * | 7/2001 | Basceri et al. | 438/240 |
| 2001/0032995 A1 * | 10/2001 | Maria et al. | 257/310 |

OTHER PUBLICATIONS

G.B. Alers, et al., "Intermixing at the Tantalum Oxide/Silicon Interface In Gate Dielectric Structures", Sep. 14, 1998, American Institute of Physics, Applied Physics Letters, vol. 73, No. 11, pp. 1517–1519.

G.D. Wilk, et al., "Stable Zirconium Silicate Gate Dielectrics Deposited Directly On Silicon", Jan. 3, 2000, American Institute of Physics, Applied Physics Letters, vol. 76, No. 1, pp. 112–114.

G.D. Wilk, et al., "Electrical Properties Of Hafnium Silicate Gate Dielectrics Deposited Directly On Silicon" May 10, 1999, American Institute of Physics, Applied Physics Letters, vol. 74, No. 19, pp. 2854–2856.

G.D. Wilk, et al., "Hafnium And Zirconium Silicates For Advanced Gate Dielectrics", Jan. 1, 2000, American Institute of Physics, Applied Physics Letters, vol. 87, No. 1, pp. 484–492.

M. Madou, "Characteristics of Two Means of Semiconductor Doping", Fundamentals of Microfabrication, p. 138, 1997.

M. Madou, "Pattern Transfer With Additive Trechniques", p. 139, 1997.

* cited by examiner

*Primary Examiner*—Richard Elms
*Assistant Examiner*—Adam Pyonin
(74) *Attorney, Agent, or Firm*—Ozer Teitelbaum; Richard J. Botos

(57) ABSTRACT

A method of fabricating a semiconductor device having a gate dielectric layer. The method includes the step of ion implanting at least one of Zr, Hf, La, Y, Al, Ti and Ta into the gate dielectric layer at low implant energy level to increase the dielectric constant of the dielectric layer. Subsequently, the implanted gate dielectric layer is annealed.

19 Claims, 1 Drawing Sheet

METHOD OF FABRICATING A DIELECTRIC LAYER

FIELD OF THE INVENTION

The present invention relates to semiconductors, generally, and more particularly to a method of fabricating a dielectric layer.

BACKGROUND OF THE INVENTION

A significant commercial effort has been expended on the miniaturization of semiconductor devices. With device sizes shrinking, increased attention has been paid to dielectric layers. In a field effect transistor ("FET"), such as a metal oxide semiconductor FET ("MOSFET"), a dielectric layer insulates a gate electrode from a channel formed within a semiconductor substrate.

Referring to FIG. 1, a cross sectional view of a known MOSFET 10 configuration is illustrated. MOSFET 10 comprises a channel 30 formed within a semiconductor substrate 20. Fabricated above channel 30 is a gate electrode 70. Channel 30 has an impedance, which may be changed in response to a voltage applied to gate electrode 70. Channel 30 is electrically connected to a source 40 and a drain 50. If a voltage difference is applied between source 40 and drain 50, a current may flow through channel 30. By modifying the impedance of channel 30 through the voltage applied to gate electrode 70, the amount of current flowing through channel 30 may be controlled.

Formed between channel 30 and gate 70 is a gate dielectric layer 60. Gate dielectric layer 60 has insulative properties, characterized by a dielectric constant, k. Gate dielectric layer 60 comprises silicon dioxide. Gate dielectric layer 60 enables the formation of a capacitance between channel 30 and gate electrode 70.

As the distance separating source 40 and drain 50 continues to shrink with the scaling of semiconductor devices, industry has been forced to examine ways to increase the capacitance between channel 30 and gate electrode 70. The capacitance between channel 30 and gate electrode 70 inhibits the creation of leakage currents between channel 30 and gate electrode 70, as well as between source 40 and drain 50. By increasing the capacitance between channel 30 and gate electrode 70, the potential for creating these leakage currents is substantially reduced.

The channel to gate electrode capacitance has an inverse relationship with the thickness of gate dielectric layer 60—the thinner the gate dielectric layer, the higher the capacitance. The channel to gate electrode capacitance also has a direct relationship with the dielectric constant of gate dielectric layer 60—the higher the dielectric constant, the higher the capacitance. As such, the capacitance between channel 30 and gate electrode 70 may be increased by either reducing the thickness of gate dielectric layer 60 or by increasing the dielectric constant of gate dielectric layer 60.

To date, industry has been able to form a gate dielectric layer from silicon dioxide having a thickness of 25 Å. It is believed that as semiconductor scaling continues, however, the material limitations of silicon dioxide will inhibit its use as a gate dielectric layer. At a thickness of 15 Å, silicon dioxide is approximately six (6) atomic layers thick. Practical considerations in employing a gate dielectric layer formed of silicon dioxide having a thickness of approximately six (6) atomic layers include the propensity of leakage currents to tunnel through the gate dielectric layer and damage the MOSFET. Realizing the limitations of silicon dioxide, researchers have begun to examine alternate materials having higher dielectric constants than the dielectric constant of silicon dioxide to increase the channel to gate electrode capacitance.

One group of alternative materials being explored is metal-silicon oxynitrides. In U.S. Pat. No. 6,020,243, issued on Feb. 1, 2000 to Wallace et al. (hereinafter "Wallace"), a method of fabricating a gate dielectric layer comprising a metal-silicon oxynitride is disclosed. Wallace proposes forming a dielectric layer comprising silicon-oxynitride in combination with titanium (Ti), zirconium (Zr), or hafnium (Hf) by a deposition step. It appears that the method of Wallace, however, produces a sub-optimal gate dielectric layer having a varying thickness of approximately 40–50 Å.

Another group of alternative materials being explored is metal silicates. In U.S. Pat. No. 5,907,780, issued on May 25, 1999 to Gilmer et al. (hereinafter "Gilmer"), a method of fabricating a gate dielectric layer comprising a metal silicate is disclosed. Gilmer proposes a gas cluster ion implantation step for implanting silicon atoms into a metal-oxide gate dielectric layer. This gas cluster ion implantation step, however, requires supercooling a gas from which clusters of silicon atoms to be ionized are formed. The method of Gilmer, thus, raises issues regarding cost effectiveness.

Consequently, a need remains for a cost-effective method of fabricating a gate dielectric layer having a dielectric constant, k, greater than the dielectric constant of silicon dioxide.

SUMMARY OF THE INVENTION

We have invented a cost-effective method of fabricating a dielectric layer having a dielectric constant, k, greater than the dielectric constant of silicon dioxide, silicon oxynitride, as well as a silicon-oxide-silicon nitride stack.

Our method comprises an ion implantation step for implanting a transition metal into a dielectric layer. The transition metal is selected from a group consisting of Zr, Hf, La, Y, Al, Ti, Ta, and combinations thereof, while the dielectric layer is selected from the group consisting of silicon dioxide, silicon oxynitride and silicon-oxide-silicon nitride.

In an embodiment of the present invention, our ion implantation step is performed such that the transition metal atoms are substantially contained within the dielectric layer.

In another embodiment of the present invention, an anneal step is performed on the implanted dielectric layer. This anneal step allows for a more uniform distribution of the transition metals in the dielectric layer. The anneal step also corrects damage to the implanted dielectric layer. The implantation of metal ions into the dielectric layer creates dangling bonds. Dangling bonds are defined as broken or incomplete chemical bonds between atoms of the dielectric layer. By annealing the implanted dielectric layer, these dangling bonds are reformed.

These and other advantages, objects and embodiments will become apparent to those skilled in the art from the following detailed description read in conjunction with the appended claims and the drawings attached hereto.

BRIEF DESCRIPTION OF THE DRAWINGS

The present invention will be better understood from reading the following description of non-limiting embodiments, with reference to the attached drawings, wherein below:_

It should be emphasized that the drawings of the instant application are not to scale but are merely schematic representations, and thus are not intended to portray the specific parameters or the structural details of the invention, which can be determined by one of skill in the art by examination of the information herein.

DETAILED DESCRIPTION OF THE PRESENT INVENTION

The present invention is directed to semiconductor devices, such as integrated circuits, and integrated or discrete components, employing a layer of dielectric material having a dielectric constant, k, greater than the dielectric constant of silicon dioxide, silicon oxynitride, as well as a silicon-oxide-silicon nitride stack. Silicon dioxide has a dielectric constant, k, of approximately 3.9, and may be formed by various known methods, such as performing a thermal growth step or a rapid thermal oxidation step. Silicon oxynitride and silicon oxide-silicon nitride both have dielectric constants, k, ranging from 4 to 7, and may be formed by various known methods.

The present invention is directed to a dielectric layer, and a method of making the dielectric layer. The dielectric layer, as formed according to the present invention, comprises at least one of metal silicon dioxide and metal silicon oxynitride. The dielectric layer may be used for various applications requiring a dielectric constant higher than the dielectric constant of silicon dioxide, silicon oxynitride or a silicon-oxide-silicon nitride stack. One such application is a gate dielectric layer in a MOSFET device, though other uses of the present invention will become apparent to skilled artisans from the instant disclosure.

Figure 1:
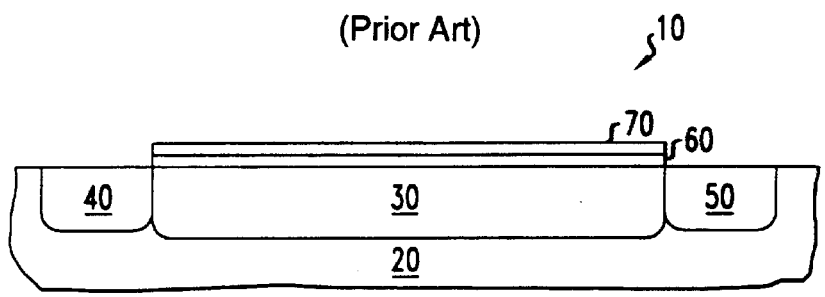
FIG. 1 is a cross-sectional view of a known MOSFET.
Figure 2:
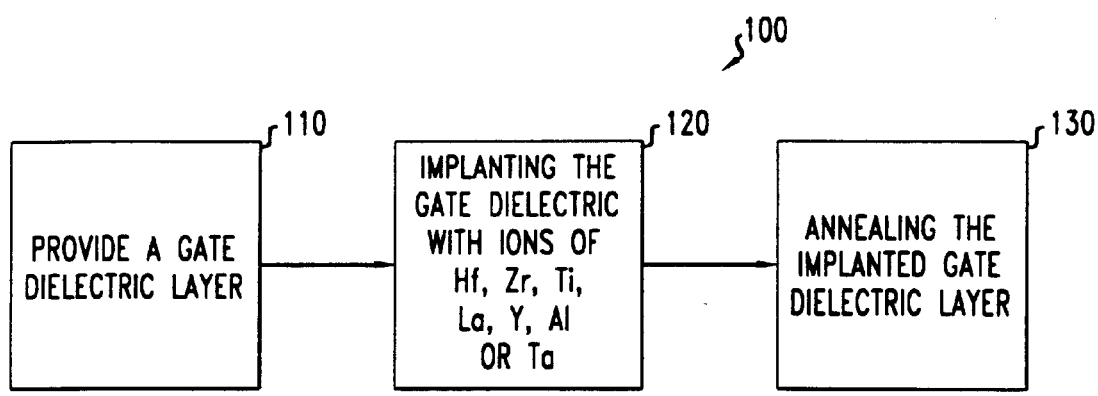
FIG. 2 is a flow chart of an embodiment of the present invention.

Referring to FIG. 2, a flow chart 100 for a method of increasing the dielectric constant of a dielectric layer is illustrated according to an embodiment of the present invention. Initially, a dielectric layer comprising at least one of silicon dioxide, silicon oxynitride, and a silicon oxide-silicon nitride stack is provided. It should be noted that the dielectric layer may be a gate dielectric layer formed above a channel of a field effect transistor having a thickness in the approximate range of 15 Å and 250 Å.

Upon forming the dielectric layer, an ion implantation step is performed. Ion implantation is a known process step involving the introduction of accelerated ions into a substrate by a relatively high energy source—on the order of kilo-electron volts ("keV"). The accelerated atoms penetrate the surface of the substrate at a depth in the range of 0.001 $\mu$m to 1.0 $\mu$m. The depth at which the accelerated atoms penetrate the surface of the substrate corresponds with the atomic number and energy of the accelerated atom. For more information on ion implantation, see Campbell, Science and Engineering of Microelectronic Fabrication, Oxford University Press, 1996 (hereinafter "Campbell"), Madou, Fundamentals of Fabrication, CRC Press, 1997 (hereinafter "Madou"), and Van Nostrand's Scientific Encyclopedia, Van Nostrand Reinhold, 1989 (hereinafter "Van Nostrand"), all of which are hereby incorporated by reference.

In the present embodiment, a low implant energy is employed. For the purposes of the present disclosure, a low implant energy is less than or equal to five (5) keV. In one embodiment, the implant energy is substantially in the range of 0.5 to 1.0 keV for a gate dielectric layer having a thickness of approximately 100 Å.

In the alternative, the ion implantation step may comprise a plasma immersion implantation step or a gas cluster ion beam implantation step. Plasma immersion and gas cluster ion beam implantation both allow for the implantation of higher ion doses at lower energies over shorter periods of time than conventional ion implantation methodologies. For more information on plasma immersion implantation, see Chu, "Plasma Doping: Progress and Potential," Solid State Technology, 42(9), September 1999, Chu, et al., "Plasma Doping: Progress and Potential," Solid State Technology, 42(10), October 1999, and Shao, et al., U.S. Pat. No. 5,654,043, all of which are hereby incorporated by reference. For more information on gas cluster ion beam implantation, see Yamada and Matsuo, "Gas Cluster Ion Beam Processing for ULSI Fabrication," Material Research Society Symposium Proceedings, Volume 427, pp. 265–274, hereby incorporated by reference.

The ion implant step causes a dose of transition metal ions to be implanted into the dielectric layer according to a Gaussian concentration profile to a first order approximation. The implant conditions are selected such that the dose of transition metal ions is substantially contained in the dielectric layer. As such, if the dielectric layer is a gate dielectric layer, the source and drain, as well as various other areas of the MOSFET, are substantially not impacted by performing the implant step. The transition metal to be implanted is selected from the group including Zr, Hf, La, Y, Al, Ti and Ta, as well as combinations thereof. Alternate metals having a high atomic number that are stable and compatible with silicon at temperatures over 500° C. are also contemplated by the present disclosure.

In one embodiment of the present invention, the dose of the transition metal ions implanted into the dielectric layer is in the approximate range of $1\times10^{15}$ atoms/cm$^2$ to $1\times10^{16}$ atoms/cm$^2$. It is believed that a dose in the approximate range of $3\times10^{15}$ atoms/cm$^2$ and $5\times10^{15}$ atoms/cm$^2$, implanted into a dielectric layer having a thickness of approximately 100 Å, will result in a dopant concentration in the approximate range of $3\times10^{21}$ atoms/cm$^3$ and $5\times10^{21}$ atoms/cm$^3$—or, in other words, a concentration of transition metal atoms within the gate dielectric of approximately six (6%) to ten (10%) percent. It should be apparent to skilled artisans from the present disclosure that alternate dosages implanted into dielectric layers having differing thicknesses will yield varied metal atom concentrations.

Ion implantation causes atomic displacements from the implanted ions in the gate dielectric layer. Even at the low level implant energy contemplated by the present invention, these atomic displacements damage the dielectric layer by breaking the chemical bonds between the atoms of the layer. Consequently, dangling bonds are created.

In view of this damage, an anneal step is performed to heat the implanted dielectric layer. The step of annealing may be performed in a furnace or by using a rapid thermal annealing tool. In one embodiment, the anneal step heats the implanted dielectric layer to a temperature substantially within the range of 600° C. and 1100° C., for a period substantially within the range of one (1) second and twenty-four (24) hours. By annealing, the dangling bonds within the implanted dielectric layer are reformed. The anneal step also changes the concentration profile of the implanted dielectric layer. Initially, the implanted metal atoms have a Gaussian first order approximation concentration profile. The step of annealing, however, advantageously distributes the implanted metal atoms more uniformly within the implanted dielectric layer.

Consequently, the dielectric layer has an increased dielectric constant over the dielectric constant of silicon dioxide, silicon oxynitride, or a silicon-oxide-silicon nitride stack. It is anticipated that by employing the process steps disclosed herein, an implanted and annealed dielectric layer may be formed having a dielectric constant, k, of at least 11 to 12.

In one embodiment of the present invention, an implanted and annealed dielectric layer has a thickness of 100 Å and a dopant concentration in the approximate range of $3\times10^{21}$ atoms/cm$^3$ and $5\times10^{21}$ atoms/cm$^3$. As a result, six (6%) to ten (10%) percent of the total atoms within the implanted and annealed dielectric layer are implanted transition metal atoms. The implanted and annealed dielectric layer is believed to have a leakage current in the approximate range of $1\times10^{-6}$ to $1\times10^{-2}$ A/cm$^2$ at a gate bias of 1V. Leakage current is defined as current density that may flow through a dielectric layer at a particular voltage. A typical leakage current is negligible at 1V for a gate dielectric layer formed from silicon dioxide, silicon oxynitride or a silicon oxide-silicon nitride stack. Moreover, the implanted and annealed dielectric layer of the present embodiment is anticipated to have a breakdown field of at least 4–5 MV/cm. Breakdown field is defined as the electric field at which the dielectric properties of a dielectric layer fail, enabling a current per unit area of more than 1 A/cm$^2$ to flow through the dielectric layer. A typical field for a gate dielectric of 100A may be in approximate range of 9–15 MV/cm.

Figure 3:
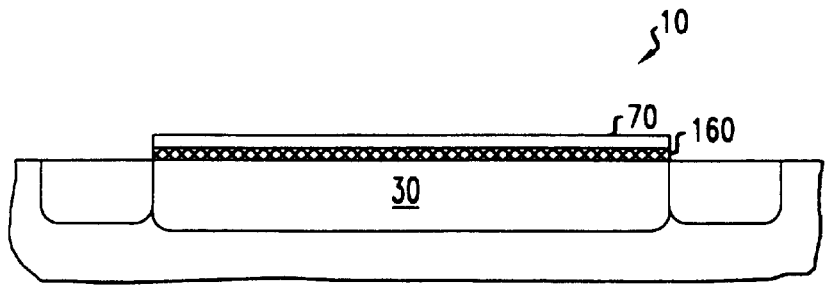
FIG. 3 is a cross-sectional view of a further embodiment of the present invention.

Referring to FIG. 3, a gate dielectric layer 160 is illustrated according to a further embodiment of the present invention. Gate dielectric layer 160 is fabricated according to the process steps detailed hereinabove. As shown, gate dielectric layer 160 is formed between channel 30 and gate electrode 70 of MOSFET 10.

EXAMPLES

In a first experiment, a computer simulation was performed using a commercially available software application, IMSIL. The simulation was run to establish the viability of implanting Ti, Zr and Hf into thin film dielectric layers. The IMSIL software simulation results, as shown in TABLE 1, illustrate the feasibility of forming films using Ti, Zr and Hf implanted at energies between 0.4 keV and 0.5 keV.

For the purpose of tables herein, the term "range" is defined as the depth of the peak in the distribution of the implant. The term "straggle" is a measure of the width of the distribution, while the term "tail" is defined as the depth at which less than one atom in 100,000 has penetrated from the surface. The "dose" is the number of implanted metal atoms required for an average concentration of ten atomic percent of metal is $3.4\times10^{15}$. Both the dose and energy levels are within the range of commercially available implantation tools.

The data from TABLE 1 hereinbelow demonstrates that Ti, Zr and Hf may be implanted into and contained within a dielectric film having a thickness of approximately 50 Å at implant energies between 0.4 keV and 0.5 keV. A metal dielectric film having a thickness of approximately 50 Å and a dielectric constant, k, in the range of at least 11 to 12, is believed to be equivalent to a silicon dioxide film having a thickness in the range of 12.5 Å and 15 Å. Consequently, it is anticipated that such a metal dielectric film would have a higher capacitance per unit area than that of a silicon dioxide film having a thickness of 15 Å.

TABLE 1

| Metal | Energy (keV) | Dose (atoms/cm$^2$) | Range/Straggle Å | Tail Å |
|---|---|---|---|---|
| Zr | 0.5 | 3.4 × 10$^{15}$ | 22/5 | 47 |
| Hf | 0.4 | 3.4 × 10$^{15}$ | 30/4 | 48 |
| Ti | 0.4 | 3.4 × 10$^{15}$ | 16/6 | 46 |

To independently verify the first experiment and associated calculations, a second computer simulation was run using another commercially available software application, SRIM-2000. Again, the simulation was run to establish the viability of forming films with implanted Ti, Zr and Hf into thin film dielectric layers. The SRIM-2000 software simulation data, as shown in TABLE 2, illustrates the feasibility of forming films from implanted Ti, Zr and Hf at implant energies between 0.4 keV and 0.5 keV. These results are substantially the same as those derived in TABLE 1 from the IMSIL software simulation. As both simulation tools yield substantially similar results, it is believed that Ti, Zr and Hf may be implanted and contained within the dielectric layer at energies and doses achievable with existing commercially available tools.

TABLE 2

| Metal | Energy (keV) | Dose (atoms/cm$^2$) | Range/Straggle Å |
|---|---|---|---|
| Zr | 0.5 | 3.4 × 10$^{15}$ | 25/7 |
| Hf | 0.4 | 3.4 × 10$^{15}$ | 29/5 |
| Ti | 0.4 | 3.4 × 10$^{15}$ | 21/8 |

In a third experiment, a computer simulation was run using IMSIL to establish the viability of implanting a broader range of transition metals into a silicon dioxide layer approximately 50 Å thick. The IMSIL software simulation results, as shown in TABLE 3, illustrate the feasibility of forming dielectric films incorporating implanted La, Y, Al, and Ta, at implant energies of less than 0.5 keV. The tabulated data also demonstrates that at particular implant energies and doses, La, Y, Al, and Ta may be implanted and contained in a dielectric film having a thickness of approximately 50 Å to 60 Å. It is expected that these films will result in a significant increase in the dielectric constant, k, over that of silicon dioxide. It is believed that such an implanted dielectric film would also be equivalent to a silicon dioxide film having a thickness in the range of 12.5 Å and 15 Å. Consequently, it is anticipated that such a metal dielectric film would have a higher capacitance per unit area than a silicon dioxide film having a thickness of 15 Å.

TABLE 3

| Metal | Energy (keV) | Dose (atoms/cm$^2$) | Range/Straggle Å | Tail Å |
|---|---|---|---|---|
| La | 0.5 | 3.4 × 10$^{15}$ | 28/5 | 47 |
| Y | 0.5 | 3.4 × 10$^{15}$ | 22/5 | 47 |
| Al | 0.3 | 3.4 × 10$^{15}$ | 14/6 | 47 |
| Ta | 0.4 | 3.4 × 10$^{15}$ | 30/4 | 47 |

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Thus, while the present invention details a process of fabricating a gate dielectric, it should be apparent to skilled artisans that the present invention may be applied to dielectric layers generally, as well as other devices requiring a dielectric layer having a higher dielectric constant than the dielectric constants of silicon dioxide, silicon oxynitride, and a silicon-oxide-silicon nitride stack. It is therefore contemplated that the appended claims will cover any such modifications or embodiments as fall within the true scope of the invention.

What is claimed is:

1. A method of fabricating a semiconductor device comprising:

forming a gate dielectric layer on a semiconductor substrate; and implanting the gate dielectric layer with ions from at least one of Zr, Hf, La, Y, Al, Ti and Ta wherein approximately 6–10% of the atoms in the implanted gate dielectric layer are the implanted ions.

2. The method of claim 1, wherein the gate dielectric layer comprises at least one of silicon dioxide, silicon oxynitride, and a silicon-oxide-silicon nitride.

3. The method of claim 2, wherein the gate dielectric layer is thermally grown and has a thickness of at least 15 Å.

4. The method of claim 2, wherein the step of implanting the gate dielectric layer with ions is performed at an implant energy level of at most 5 keV.

5. The method of claim 2, wherein the step of ion implanting the gate dielectric layer with ions employs a dopant dosage of $1 \times 10^{15}$ atoms/cm$^2$ to $1 \times 10^{16}$ atoms/cm$^2$.

6. The method of claim 2, further comprising annealing the implanted gate dielectric layer at a temperature in the range of 600° C. to 1100° C.

7. The method of claim 6, wherein the annealed gate dielectric layer has a thickness of approximately 100 Å, is implanted using a dopant ion dosage in the range of about $3 \times 10^{15}$ atoms/cm$^2$ and $5 \times 10^{15}$ atoms/cm$^2$ and an implant energy level of approximately 0.5 keV has a breakdown field of at least 5 MV/cm and a leakage current in the approximate range of $1 \times 10^{-6}$ A/cm$^2$ and $1 \times 10^{-2}$ A/cm$^2$.

8. A method of forming a dielectric layer, the method comprising the steps of:

forming a dielectric layer on a semiconductor substrate; and ion implanting the dielectric layer with ions from at least one of Zr, Hf, La, Y, Al, Ti and Ta, at a dosage of $1 \times 10^{15}$ atoms/cm$^2$ to $1 \times 10^{16}$ atoms/cm$^2$, and an implant energy level of at most 5 keV; and annealing the ion implanted dielectric layer to a temperature in the range of 600° C. to 1100° C. for in the range of one (1) second and twenty four (24) hours.

9. The method of claim 8, wherein the dielectric layer comprises at least one of silicon dioxide, silicon oxynitride, and silicon-oxide-silicon nitride.

10. The method of claim 9, wherein approximately 6 10% of the total atoms in the implanted dielectric layer are at least one of Zr, Hf, La, Y, Al, Ti and Ta.

11. A method of forming a dielectric layer, the method comprising the steps of:

forming a dielectric layer on a semiconductor substrate; and implanting a dielectric layer with ions from a transition metal having a higher dielectric constant than the dielectric layer at an implant energy level of at most 5.0 keV wherein approximately 6–10% of the atoms in the implanted dielectric layer are the implanted ions; and annealing the implanted dielectric layer.

12. The method of claim of 11, wherein the transition metal comprises at least one of Zr, Hf, La, Y, Al, Ti and Ta.

13. The method of claim 12, wherein the dielectric layer comprises at least one of silicon dioxide, silicon oxynitride, and silicon-oxide-silicon nitride.

14. The method of claim 12, wherein the dielectric layer has a thickness of at least 20 Å and comprises at least one of thermally grown silicon dioxide, thermally grown silicon oxynitride and a thermally grown silicon oxide-silicon nitride.

15. The method of claim 12, wherein the step of implanting the dielectric layer is performed at an implant energy of 5.0 keV.

16. The method of claim 12, wherein the step of implanting the dielectric layer with ions employs a dopant dosage of $1 \times 10^{15}$ atoms/cm$^2$ to $1 \times 10^{16}$ atoms/cm$^2$.

17. The method of claim 12, further comprising the step of annealing the implanted dielectric layer to a temperature substantially in the range of 600° C. to 1100° C.

18. The method of claim 14, wherein the annealed implanted dielectric layer has a thickness of approximately 100 Å, is implanted using a dopant ion dosage of approximately $3 \times 10^{15}$ atoms/cm$^2$ and an implant energy level of at most 5.0 keV and has a breakdown field of at least 5 MV/cm, and a leakage current in the range of $1 \times 10^{-6}$ A/cm$^2$ and $1 \times 10^{-2}$ A/cm$^2$.

19. A transistor comprising an implanted and annealed gate dielectric layer, the implanted and annealed gate dielectric layer comprising at least one of Zr, Hf, La, Y, Al, Ti and Ta which constitute 6% to 10% of the atoms in the implanted layer.

* * * * *